United States Patent [19]
Roehl

[11] Patent Number: 5,464,793
[45] Date of Patent: Nov. 7, 1995

[54] METHOD OF MAKING CONTACT FOR SEMICONDUCTOR DEVICE

[75] Inventor: Siegfried Roehl, Sauerlach, Germany

[73] Assignee: Siemens Aktiengesellschaft, Munich, Germany

[21] Appl. No.: 317,151

[22] Filed: Oct. 3, 1994

Related U.S. Application Data

[63] Continuation of Ser. No. 160,318, Nov. 29, 1993, abandoned, which is a continuation of Ser. No. 937,921, Aug. 31, 1992, abandoned.

[51] Int. Cl.$^6$ ................................. H01L 21/44
[52] U.S. Cl. .................. 437/186; 437/191; 437/940
[58] Field of Search ........................ 437/186, 191, 437/193, 940, 979, 985; 148/DIG. 116

[56] References Cited

U.S. PATENT DOCUMENTS

| | | | |
|---|---|---|---|
| 3,886,004 | 5/1975 | Bruchez | 148/187 |
| 4,123,564 | 10/1978 | Ajima et al. | 427/85 |
| 4,127,931 | 1/1978 | Shiba . | |
| 4,694,561 | 9/1987 | Lebowitz | 437/52 |
| 4,717,678 | 1/1988 | Goth | 437/27 |
| 4,927,779 | 5/1990 | Dhong et al. | 428/52 |
| 5,198,386 | 3/1993 | Gonzalez | 437/52 |

FOREIGN PATENT DOCUMENTS 54-158167  12/1979  Japan .

OTHER PUBLICATIONS

Patent Abstracts of Japan, vol. 4, No. 18 (E–171) 13 Feb. 1980.

Wolf and Tauber, "Silicon Processing", vol. I (1986) pp. 213–215 and 535–536.

Wolf, "Silicon Processing", vol. II (1990) pp. 258–259.

*Primary Examiner*—Olik Chaudhuri
*Assistant Examiner*—C. Everhart
*Attorney, Agent, or Firm*—Adel A. Ahmed

[57] ABSTRACT

A method of forming a capped and borderless contact of polysilicon on a body of a semiconductor material includes depositing a layer of undoped polysilicon on the surface of the body and forming an opening therethrough to the surface of the body. The side walls of the opening are then coated with a layer of silicon nitride and the opening is then filled with doped polysilicon which forms the contact. The doped and undoped polysilicon are heated in an oxidizing atmosphere to grow a layer of silicon dioxide thereon having a thicker portion over the doped polysilicon then over the undoped polysilicon. The silicon dioxide layer is etched to remove the thinner portion leaving the thicker portion over the doped polysilicon as a capping layer. The undoped polysilicon is then etched away and a layer of a dielectric material is deposited on the body and surrounding the doped polysilicon contact.

14 Claims, 2 Drawing Sheets

METHOD OF MAKING CONTACT FOR SEMICONDUCTOR DEVICE

CROSS-REFERENCE TO RELATED APPLICATION

This is a continuation of Ser. No. 08/160,318 filed Nov. 29, 1993, now abandoned, which is a continuation of Ser. No. 07/937,921 filed Aug. 31, 1992 now abandoned.

FIELD OF THE INVENTION

The present invention relates to a method of making a conductive contact for a semiconductor device, and more particularly, to a method of making a capped and borderless contacts for semiconductor devices, such as integrated circuits.

BACKGROUND OF THE INVENTION

Contacts for semiconductor devices are conductive regions on a surface of a semiconductor body which make electrical contact to the body or conductive regions in the body. Capped contacts are those which are completely surrounded by insulating material. Borderless contacts are those which can overlap isolation or gate areas of semiconductor devices. For high density integrated circuits, such as dynamic random access memories (DRAMs), forming such capped and borderless contacts is very difficult, particularly in a full scale manufacturing process. Such contacts are, however, required for high density types of integrated circuits such as DRAMs. Especially the inner node contact from transfer transistor to storage electrode requires these capped and borderless contacts. Capping is necessary to allow other conducting layers to cross over the contact area as is e.g. required by bitlines in DRAM memories. One technique for forming capped and borderless contacts is to form the contacts of doped polysilicon. The doped polysilicon contacts regions are formed in openings in undoped (intrinsic) polysilicon. The undoped polysilicon can easily be etched selective to gate encapsulations or isolations to allow overlap or borderlessness. However, the undoped polysilicon must then be removed and replaced with an insulating material of low dielectric constant, such as silicon dioxide. Standard masking systems for removing the undoped polysilicon without damaging the doped polysilicon contact regions are difficult to control or they require special selective etchants. Therefore, it is desirable to have a method of forming capped borderless doped polysilicon contacts which is relatively simple to carry out and can be readily used in a manufacturing process.

SUMMARY OF THE INVENTION

An aspect of the present invention is directed to a method of making borderless contacts of doped polysilicon in openings in undoped polysilicon in which a self-aligned masking layer of silicon dioxide is formed over the doped polysilicon. This is achieved by thermally growing the silicon dioxide over both the doped and undoped polysilicon with the thickness of the silicon dioxide layer being greater over the doped polysilicon than over the undoped polysilicon. The thinner portions of the silicon dioxide layer over the undoped polysilicon can then be easily removed by etching while still leaving a portion of silicon dioxide over the doped polysilicon.

The method of the present invention for making a semiconductor device conductive contact to a body of semiconductor material includes forming a layer of undoped polysilicon on a surface of the body. An opening is formed in the undoped polysilicon layer and the opening is filled with doped polysilicon. A layer of silicon dioxide is grown over both the undoped and doped polysilicon with the silicon dioxide layer over the doped polysilicon being thicker than over the undoped polysilicon. The thinner portions of the silicon dioxide layer over the undoped polysilicon are then removed leaving the silicon dioxide only over the doped polysilicon. The undoped polysilicon is then removed.

Viewed from another aspect, the present invention is directed to a method of making a conductive contact to a surface of a body of a semiconductor material. The method comprises the steps of depositing on the surface of the body a layer of undoped polysilicon; forming an opening through the undoped polysilicon layer to the surface of the body; coating side walls of the opening with a layer of silicon nitride or another insulating film; filling the remaining portion of the opening with doped polysilicon; heating the doped and undoped polysilicon in an oxidizing atmosphere to grow a layer of silicon dioxide thereon which is thicker over the doped polysilicon than over the undoped polysilicon; etching the silicon dioxide layer so as to remove the portion thereof over the undoped polysilicon while leaving a portion of the silicon dioxide layer over the doped polysilicon; removing the undoped polysilicon; and forming a layer of a dielectric material on the body surface surrounding the doped polysilicon.

The invention will be better understood from the following more detailed description taken with the accompanying drawings.

It should be understood that the drawings are not necessarily to scale.

DETAILED DESCRIPTION

Figure 1:
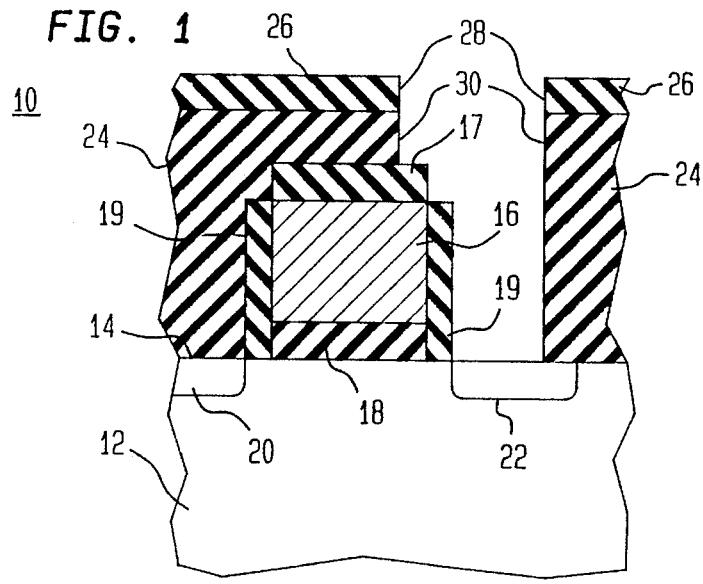
FIGS. 1–6 are cross-sectional view of a semiconductor device, illustrating the various steps of the method of the present invention for forming a device with a borderless contact.

Referring now to FIG. 1, there is shown a cross-sectional view of a portion of a metal-oxide-semiconductor (MOS) field effect transistor (FET) 10 as it appears at the start of the method of the present invention for forming a borderless contact. The transistor 10 comprises a substrate body 12 of a semiconductor material, such as single crystalline silicon, having a surface 14. On a portion of the surface 14 is a gate 16 of a conductive material, such as conductive polysilicon. The gate 16 is insulated from the surface 14 by a thin gate dielectric layer 18 which is typically of silicon dioxide. The gate 16 is covered with an encapsulation layer 17, typically of silicon dioxide, and has sidewall spacers 19 along each side, also typically of silicon dioxide. In the body 12 and at the surface 14 are source and drain regions 20 and 22 of a desired conductivity type. The source and drain regions 20 and 22 are at opposite sides of the gate 16. For illustrative purposes the transistor 10 is an n-channel insulated gated field effect transistor (IGFET) with the body being of p-type conductivity and the source and drain regions 20 and 22, respectively, being of n-type conductivity. The method of the present invention will be described with regard to forming a contact to the region 22. However, it should be understood that the method of the present invention can be used to form contacts to both of the regions 20 and 22 or to other regions formed in the body 12, such as buried capacitors of the type shown in U.S. Pat. No. 4,927,779 (S. H. Dhong, issued May 22, 1990).

The first step in the method of the present invention is to deposit a layer 24 of undoped (intrinsic) polysilicon over the body surface 14 and the gate 16. This can be achieved by the well known chemical vapor deposition technique in which the body 12 is exposed to a gas containing silicon, such as silane, and heated to decompose the gas and deposit polysilicon on the surface 14. A masking layer 26, such as of a photoresist, is coated over the polysilicon layer 24. Using standard photolithographic techniques, the masking layer 26 is provided with an opening 28 therein over the area of the body surface 14 where the contact is to be formed. The exposed portion of the polysilicon layer 24 is then removed using a suitable etchant to form an opening 30 therethrough down to the portion of surface 14 which includes a portion of the region 22.

Figure 2:
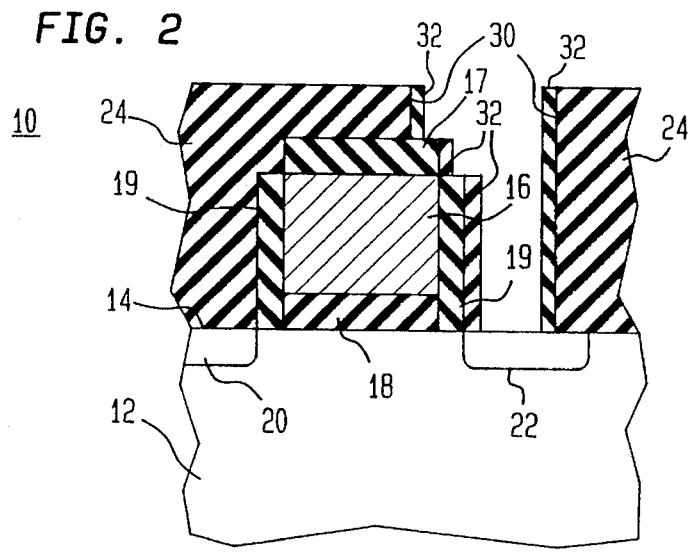

Referring now to FIG. 2, there is shown a cross-sectional view of the transistor 10 during the next steps of the method of the present invention. The masking layer 26 is removed with a suitable solvent and then side walls of the opening 30 are coated with a layer 32 of silicon nitride or another insulating material. This is achieved by depositing a layer of silicon nitride over the polysilicon layer 24, the sidewalls of the opening 30 and the exposed area of the body surface 14 at the bottom of the opening 30. The portions of the silicon nitride layer which are on the polysilicon layer 24 and the body surface 14 at the bottom of the opening 30 are then removed with an anisotropic etch, such as a plasma etch. This leaves the silicon nitride layer 32 on the sidewalls of the opening 30.

Figure 3:
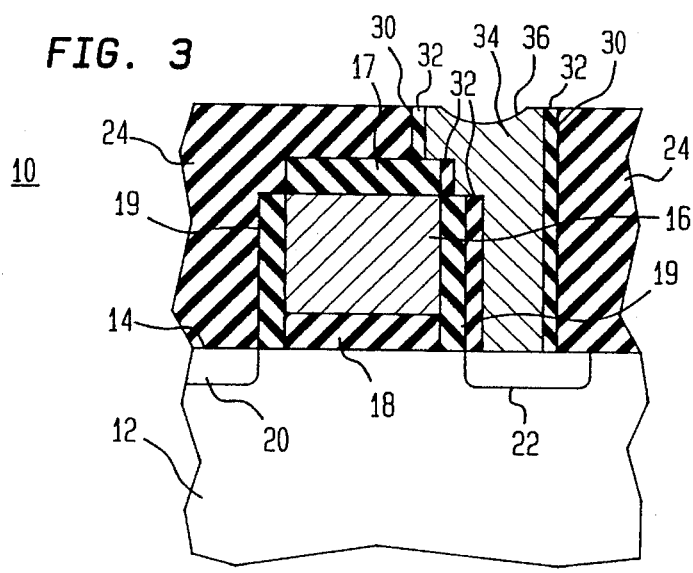

Referring now to FIG. 3, there is shown a cross-sectional view of the transistor 10 after the next step in the method of the present invention. The opening 30 is then filled with doped polysilicon to form an electrical contact 34. This is achieved by depositing a layer of doped polysilicon over the undoped polysilicon layer 24 and within the opening 30. The portion of the doped polysilicon layer over the undoped layer 24 is then removed with a suitable etchant leaving the doped polysilicon contact 34 in the opening 30. During this etching step, the contact 34 may be provided with a shallow cavity 36 in its surface. The contact 34 is doped with any suitable dopant of the desired conductivity type, such as phosphorus for n-type conductivity. Also, for reasons which will be explained, the contact 34 is preferably heavily doped to a concentration of about $5 \times 10^{20}$ impurities/cm$^3$. The doped polysilicon may be deposited by any well known chemical vapor deposition technique in which the body 12 is exposed to vapors of a gas containing silicon, such a silane, and a gas containing the desired dopant. The body 12 is heated to a temperature at which the gases decompose and deposit doped polysilicon.

Figure 4:
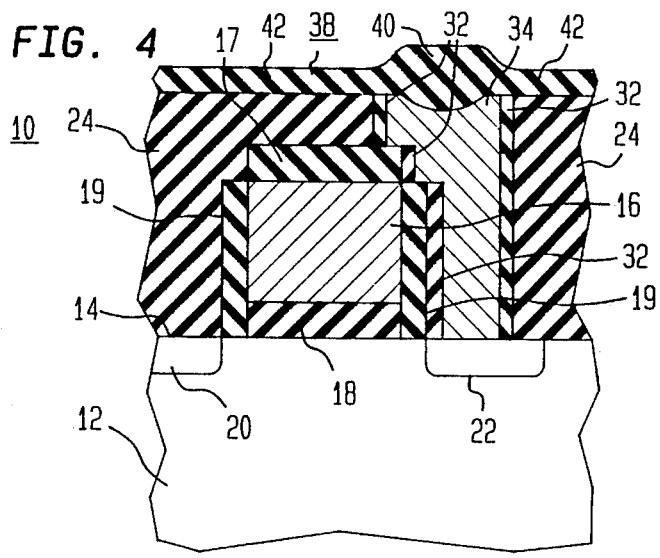

Referring now to FIG. 4, there is shown a cross-sectional view of the transistor 10 after the next step in the method of the present invention. The polysilicon layer 24 and contact 34 are then heated in an oxidizing atmosphere at a temperature at which a silicon dioxide layer 38 is formed on the surfaces of the layer 24 and the contact 34. Typically, this can be carried out in steam at a temperature of between 700° C. and 900° C. When polysilicon is oxidized in this manner, the silicon dioxide film formed on doped polysilicon is thicker than the silicon dioxide film formed on undoped polysilicon. Thus, a portion 40 of the silicon dioxide layer 36 directly over the contact 34, which is of doped polysilicon, is thicker than a portion 42 of the silicon dioxide layer 38 which is over the undoped polysilicon layer 24. By highly doping the contact 34 as stated above, the thickness of the thicker portion 40 of the silicon dioxide layer 36 can be made more than twice the thickness of the thinner portion 42.

Figure 5:
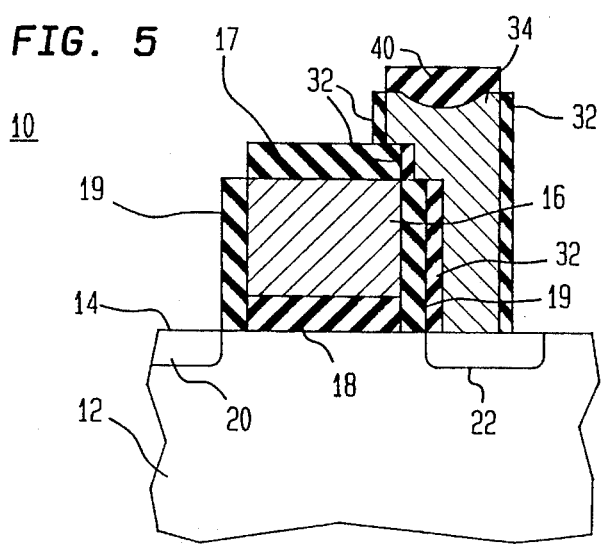

Referring now to FIG. 5, there is shown a cross-sectional view of the transistor 10 after the next step of the method of the present invention. The silicon dioxide layer 38 is then etched with a suitable etchant until the thinner portion 42 of the silicon dioxide layer 38 is completely removed from over the undoped polysilicon layer 24. Although the thicker portion 42 of the silicon dioxide layer 38 is reduced in thickness, a portion still remains to provide a capping layer over the contact 34 which is self-aligned with the contact 34. The exposed portion of the undoped polysilicon layer 24 is then removed with a suitable etchant. During this etching step, the contact 34 is protected from being etched by the capping portion 40 of the layer 38 and by the sidewall silicon nitride layers 32.

Figure 6:
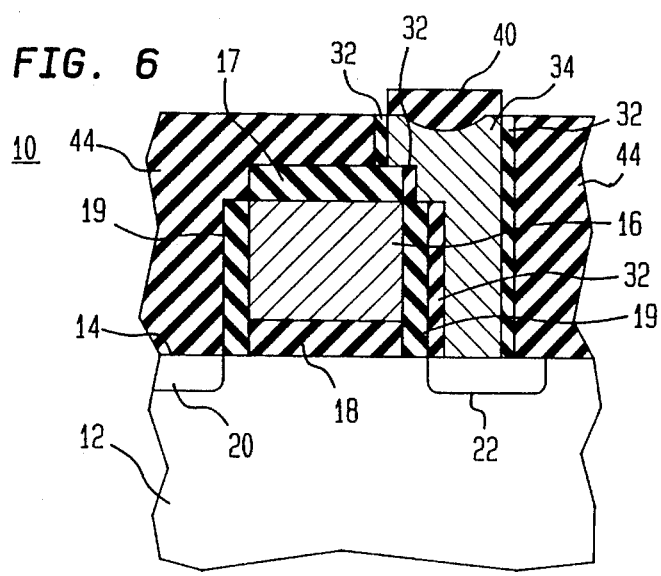

Referring now to FIG. 6, there is shown a cross-sectional view of the transistor 10 after the next step of the method of the present invention. A layer 44 of a dielectric material, such as silicon dioxide, is then deposited over the gate 16 and the exposed area of the surface 14 so as to completely encircle the contact 34. This is achieved by depositing a layer of silicon dioxide over the surface 14, the gate 16 and the contact 34 using any well known chemical vapor deposition technique. The silicon dioxide layer is then planarized, using any well known planarization technique, to form the layer 44 which encircles the contact 34 and has a surface which is planar with the surface of the contact 34. This provides the transistor 10 with a conductive contact 34 which can provide lateral contact to other areas such as e.g. trench capacitors (not shown in the drawing). The contact is borderless and capped so that the contact is isolated from crossing conductor lines. This is important since the same technique can be used to form other contacts which contact to these crossing conductor lines. Bitlines of DRAM cells are an example.

In the method of the present invention, by using the difference in the oxidation rate of doped and undoped polysilicon, a self-aligned capping layer 40 of silicon dioxide is easily formed over the contact 34. The self-aligned capping layer 40, along with the sidewall spacers silicon nitride layers 30 around the contact 34, protect the contact 34 during the removal of the undoped polysilicon layer 24 and its replacement with the dielectric layer 44. This allows the removal of the undoped polysilicon layer 24 with the use of any standard etchant which simplifies the removal of the undoped polysilicon layer. Thus, the method of the present invention provides a simple method of forming borderless contacts which can be used as part of a manufacturing process for integrated circuits containing the contacts.

It is to be appreciated and understood that the specific embodiments of the invention are merely illustrative of the general principles of the invention. Various modifications may be made consistent with the principles set forth. For example, the contact can be made to any device formed in the substrate body. Also, although only one contact has been shown as being made to the body, the device can include any desired number of the contacts as well as conductive strips connecting the contacts. These and similar changes are within the spirit of the invention which is defined by the claims following.

What is claimed is:

1. A method of making a semiconductor device conductive contact on a body of a semiconductor material comprising the steps of:

forming a layer of undoped polysilicon on a surface of the body;

forming an opening through the undoped polysilicon layer to the surface of the body;

filling said opening with doped polysilicon;

growing a layer of silicon dioxide on the doped and undoped polysilicon with the thickness of the silicon dioxide layer being thicker over the doped polysilicon than over the undoped polysilicon;

removing all of the silicon dioxide layer from over the undoped polysilicon while leaving a portion of the silicon dioxide over the doped polysilicon; and removing the undoped polysilicon layer.

2. The method of claim 1 in which the layer of silicon dioxide is grown over the polysilicon by heating the polysilicon in an oxidizing atmosphere with the portion of the silicon dioxide layer over the doped polysilicon growing thicker than the portion of the silicon dioxide over the undoped polysilicon.

3. The method of claim 2 further comprising the step of coating the side walls of the opening in the undoped polysilicon layer with a layer of silicon nitride prior to filling the opening with the doped polysilicon.

4. The method of claim 3 in which the doped polysilicon contains a concentration of dopant of about $5\times10^{20}$ impurities/cm$^3$.

5. The method of claim 4 in which the silicon dioxide layer is grown at a temperature of between 700° C. and 900° C. in steam.

6. The method of claim 5 further comprising the step of depositing a layer of silicon dioxide on the surface of the body encircling the doped polysilicon after the undoped polysilicon is removed.

7. The method of claim 6 further comprising the step of planarizing the surface of the silicon dioxide layer which surrounds the doped polysilicon so as to be planar with the surface of the doped polysilicon.

8. A method of making a conductive contact to a surface of a body of a semiconductor material comprising the steps of:

depositing on the surface of the body a layer of undoped polysilicon;

forming an opening through the undoped polysilicon layer to the surface of the body;

coating side walls of the opening with a layer of silicon nitride;

filling the remaining portion of the opening with doped polysilicon;

heating the doped and undoped polysilicon in an oxidizing atmosphere to grow a layer of silicon dioxide thereon which is thicker over the doped polysilicon than over the undoped polysilicon;

etching the silicon dioxide layer so as to remove a portion thereof over the undoped polysilicon while leaving a portion of the silicon dioxide layer over the doped polysilicon;

removing the undoped polysilicon; and forming a layer of a dielectric material on the body surface surrounding the doped polysilicon.

9. The method of claim 8 in which the doped polysilicon contains a concentration of the dopant of about $5\times10^{20}$ impurities/cm$^3$.

10. The method of claim 9 in which the silicon dioxide layer is grown at a temperature of between 700° C. and 900° C. in steam.

11. The method of claim 8 in which the opening is formed in the undoped polysilicon by forming a masking layer on the undoped polysilicon with the masking layer having an opening therethrough where the opening in the undoped polysilicon layer is to be provided, and then etching the undoped polysilicon layer through the opening in the masking layer.

12. The method of claim 11 in which the undoped polysilicon layer is removed by etching with a suitable etchant.

13. The method of claim 8 in which the dielectric layer is a layer of silicon dioxide deposited over the surface of the body.

14. The method of claim 13 further comprising the step of planarizing the surface of the silicon dioxide layer which surrounds the doped polysilicon so as to be essentially planar with the surface of the doped polysilicon.

\* \* \* \* \*